United States Patent
Shen

(10) Patent No.: US 9,330,967 B2
(45) Date of Patent: May 3, 2016

(54) METHOD OF FABRICATING A SEMICONDUCTOR DEVICE WITH REDUCED LEAK PATHS

(71) Applicant: Taiwan Semiconductor Manufacturing Company Limited, Hsinchu (TW)

(72) Inventor: Guan-Jie Shen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/279,667

(22) Filed: May 16, 2014

(65) Prior Publication Data

US 2015/0332957 A1  Nov. 19, 2015

(51) Int. Cl.
*H01L 21/768* (2006.01)
*H01L 23/522* (2006.01)

(52) U.S. Cl.
CPC ...... *H01L 21/76814* (2013.01); *H01L 23/5226* (2013.01); *H01L 21/76877* (2013.01)

(58) Field of Classification Search
CPC .......................... H01L 23/5226; H01L 23/522
See application file for complete search history.

(56) References Cited

U.S. PATENT DOCUMENTS 7,855,457 B2 * 12/2010 Mizukami et al. ............ 257/758
2015/0102419 A1 * 4/2015 Ikeda et al. ................... 257/369

* cited by examiner

*Primary Examiner* — Yu-Hsi D Sun
(74) *Attorney, Agent, or Firm* — Jones Day

(57) ABSTRACT

A method of fabricating a semiconductor device with reduced leak paths is disclosed. The method comprises etching a void in non-conductive material in the semiconductor device to provide a conduction path between isolated material, forming a non-conductive surface layer on an unintended conductive item adjacent to the void, and filling the void with a conductive material. Forming a non-conductive surface layer may comprise oxidizing a surface surrounding the void. Forming a non-conductive surface layer may comprise oxidizing a side wall of the void. Forming a non-conductive surface layer may comprise oxidizing a surface surrounding the void using plasma oxidation operations. Forming a non-conductive surface layer may comprise oxidizing a side wall of the void using plasma oxidation operations. The unintended conductive item may comprise a conductive impurity or conductive residue. The void may comprise a trench or a hole for a via.

18 Claims, 4 Drawing Sheets

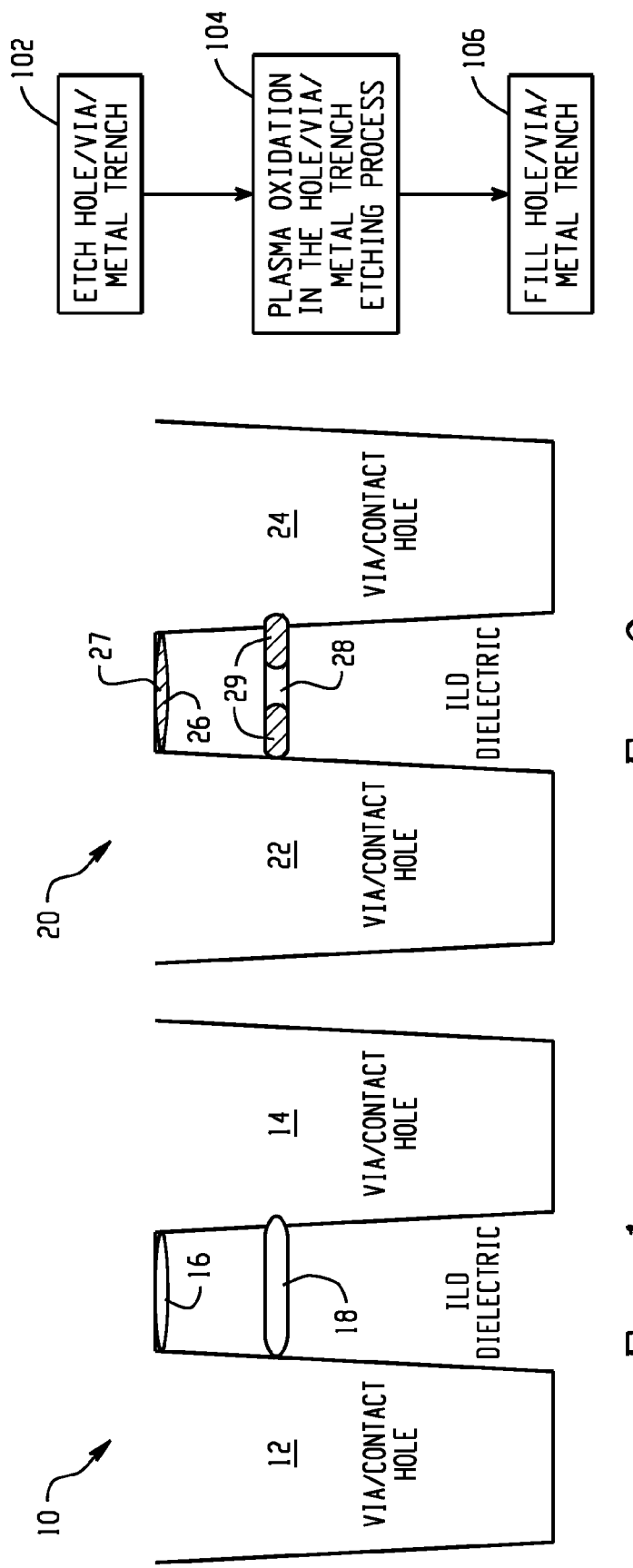

METHOD OF FABRICATING A SEMICONDUCTOR DEVICE WITH REDUCED LEAK PATHS

BACKGROUND

The technology described in this patent document relates to MOSFET devices, and more specifically to reducing leak paths in MOSFET devices.

Scaling of semiconductor devices, such as a metal-oxide semiconductor field-effect transistor (MOSFET), has enabled continued improvement in speed, performance, density, and cost per unit function of integrated circuits over the past few decades. Reducing leak paths in MOSFET devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram depicting a cross sectional view of a portion of an example semiconductor device.

FIG. 2 is a diagram depicting a cross sectional view of a portion of another example semiconductor device, in accordance with some embodiments.

FIG. 3 is a process flow chart depicting an example process for applying a non-conductive surface layer to unintended conductive items, in accordance with some embodiments.

DETAILED DESCRIPTION

Figure 4:
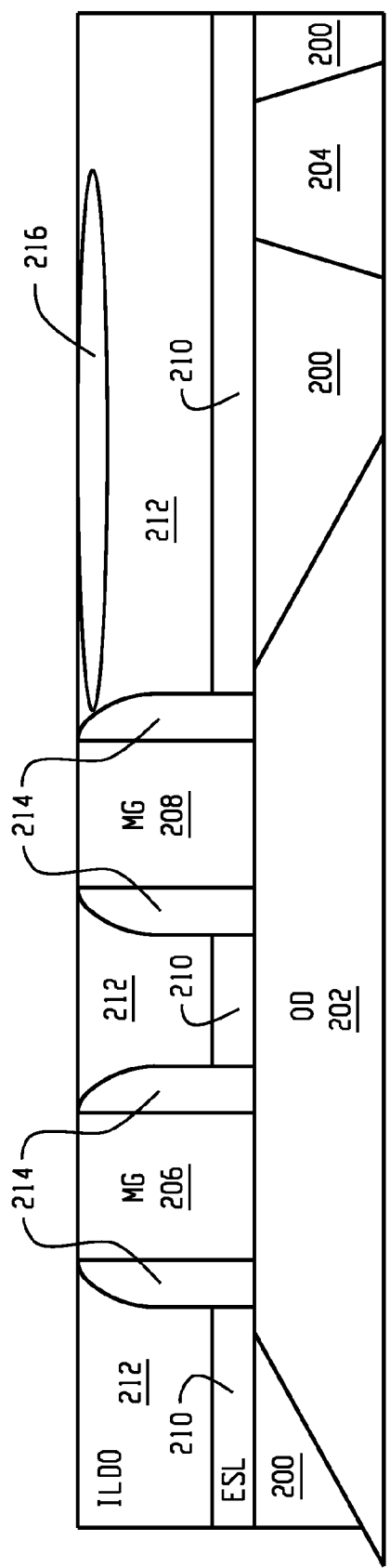
FIGS. 4-7 depict cross-sectional views of an example semiconductor device during different stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor fabrication, the pattern pitch is getting narrower and process window margins such as the over-etch window is constrained. Meanwhile, the leak tolerance is often very tight. Process metal residue, conductive by-products, or in-film conductive impurities may lead to a leak path resulting in electrical failure. The following examples provide methods to reduce the occurrence of a leak path.

FIG. 1 is a diagram depicting a cross sectional view of a portion of a semiconductor device 10. Illustrated are two voids 12, 14 that may be etched or otherwise formed in non-conductive portions of the semiconductor device 10 that may, for example, serve as a hole for a via or metal contact that provides a conduction path between material that is otherwise isolated. Also shown are two unintended conductive items 16, 18 that exist in the semiconductor device. These unintended conductive items 16, 18 may, for example, be conductive structures such as metal residue, a conductive by-product, an in-film conductive impurity, or some other unintended conductive item. Because of their particular placement in this example, the unintended conductive items may provide a leak path between the two voids after the voids are filled with metallic or other conductive material.

FIG. 2 is a diagram depicting a cross sectional view of a portion of a semiconductor device 20. Illustrated are two voids 22, 24 that may be formed in the semiconductor device 20 that may, for example, serve as a trench or a hole for a via or metal contact that provides a conduction path between material that is otherwise isolated. Also shown are two unintended conductive items 26, 28 that exist in the semiconductor device. These unintended conductive items 26, 28 may, for example, be conductive structures such as a metal or other conductive residue, a conductive by-product, an in-film conductive impurity, or some other unintended conductive item. These unintended conductive items 26, 28 have had a non-conductive surface layer material, such as a non-conductive oxide surface layer, formed on their surfaces to prevent these conductive items 26, 28 from providing a conduction path, i.e., a leak path, between the two voids 22, 24 after the voids are filled with metallic or other conductive material. The application of a non-conductive surface layer material to the unintended conductive items may reduce the occurrences of a leak path between conductive elements in the semiconductor device such as metal gates, vias, contacts, metal trenches, etc.

FIG. 3 is a process flow chart depicting an example process for applying a non-conductive surface layer to unintended conductive items near voids such as holes and trenches. In this example, a trench or a hole for a via or metal contact is formed through operations such as etching operations (operation 102). Prior to filling the trench or hole with conductive material, non-conductive surface layer application operations such as oxidation operations and more particularly plasma oxidation operations may be applied a surface surrounding the hole opening and to side walls of the hole or trench (operation 104). The application of plasma oxidation operations to a surface surrounding the hole or trench opening may cause a non-conductive oxide surface layer to be formed on an unintended conductive item located adjacent to the trench or hole opening, such as the non-conductive oxide surface layer formed on the unintended conductive item 26 of FIG. 2. The application of plasma oxidation operations to side walls of the hole or trench may cause a non-conductive oxide surface layer to be formed on an unintended conductive item located adjacent to sidewalls of the trench or hole, such as the non-conductive oxide surface layer formed on the unintended conductive item 28 of FIG. 2. After non-conductive surface layer application operations are performed, the hole or trench may be filled with conductive material such as metal material (operation 106).

FIGS. 4-7 depict cross-sectional views of an example semiconductor device during different stages of fabrication. Depicted in FIG. 4 is a semiconductor device having an substrate 200, a first oxidation diffusion (OD) region 202, a second OD region 204, a metal gate 206 of a first transistor, a metal gate 208 of a second transistor, an etch stop layer (ESL 210), an interlayer dielectric layer (ILD0 212), spacers 214 surrounding the metal gates 206, 208, and an unintended conductive item 216. The unintended conductive item 216, in this example, comprises metal gate (MG) residue or MG metallic extrusion resulting from metal gate chemical mechanical polishing (CMP) operations.

Figure 5:
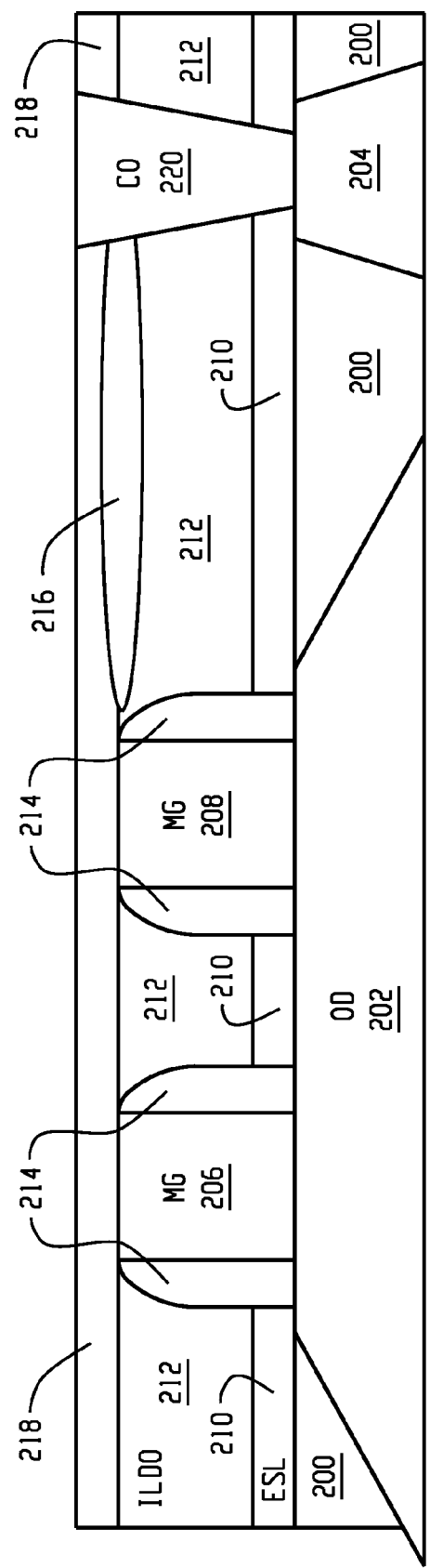

Depicted in FIG. 5, is the example semiconductor device after a second ESL 218 has been deposited and a contact hole 220 has been etched. In this example, the unintended conductive item 216 forms a conductive bridge between the contact hole 220 and the metal gate 208.

Figure 6:
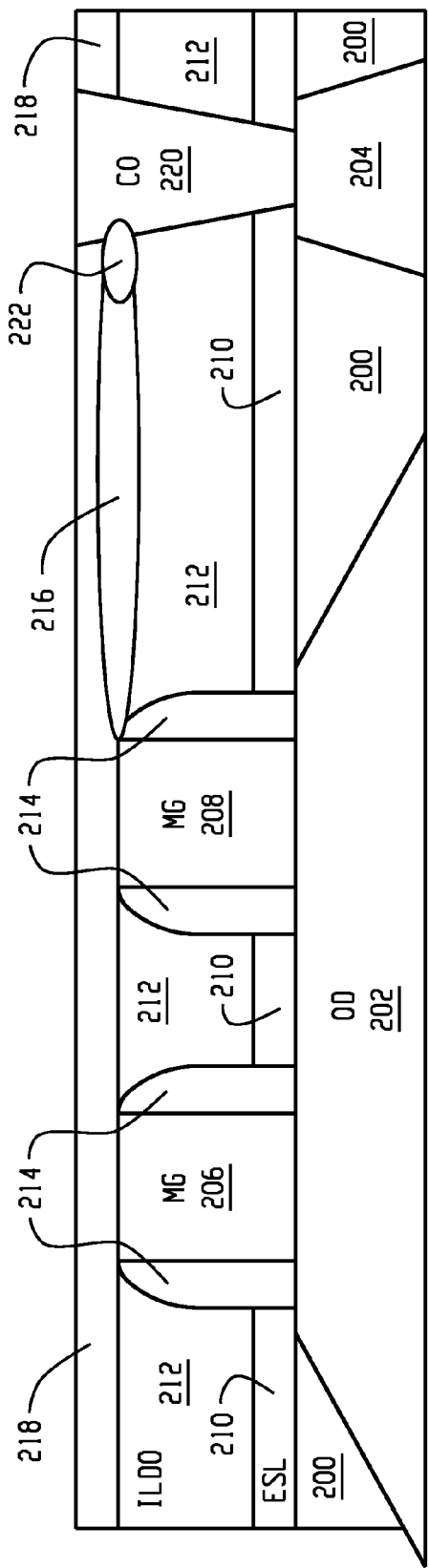

Depicted in FIG. 6, is the example semiconductor device after plasma oxidation operations have been performed on side walls of the contact hole 220. In this example, a surface area 222 of the unintended conductive item 216 has been oxidized by the plasma oxidation operations to form an insulator to prevent a conductive bridge between the contact hole 220 and the metal gate 208.

Figure 7:
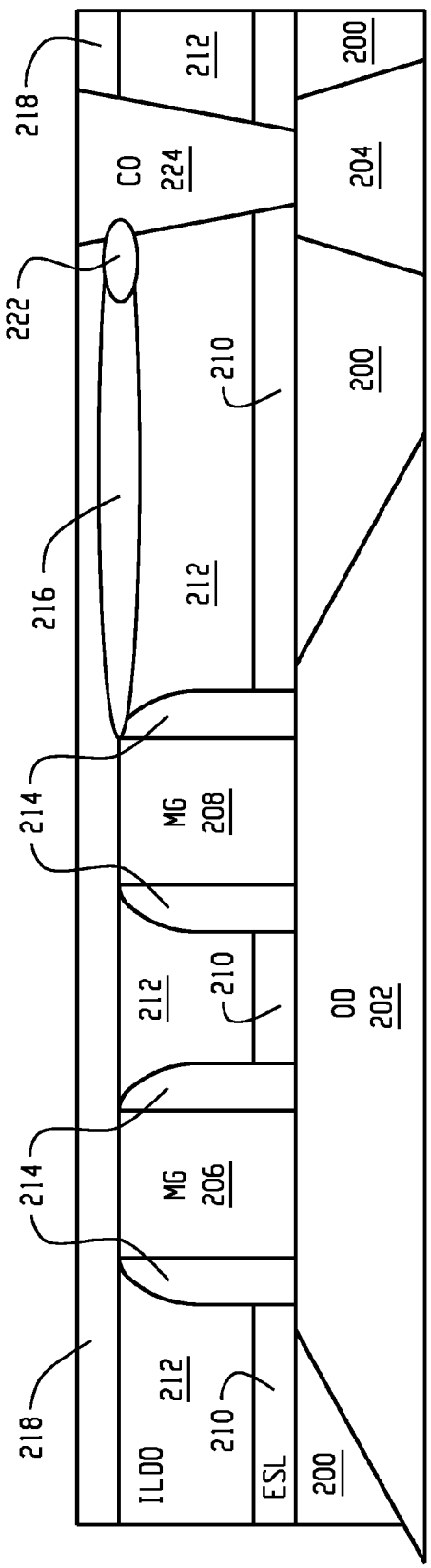

Depicted in FIG. 7, is the example semiconductor device after metal gap filling of the contact hole 220. In this example, the surface area 222 of the unintended conductive item 216 has blocked the formation of a conductive bridge between the metal 224 in the contact hole 220 and the metal gate 208.

Figure 8:
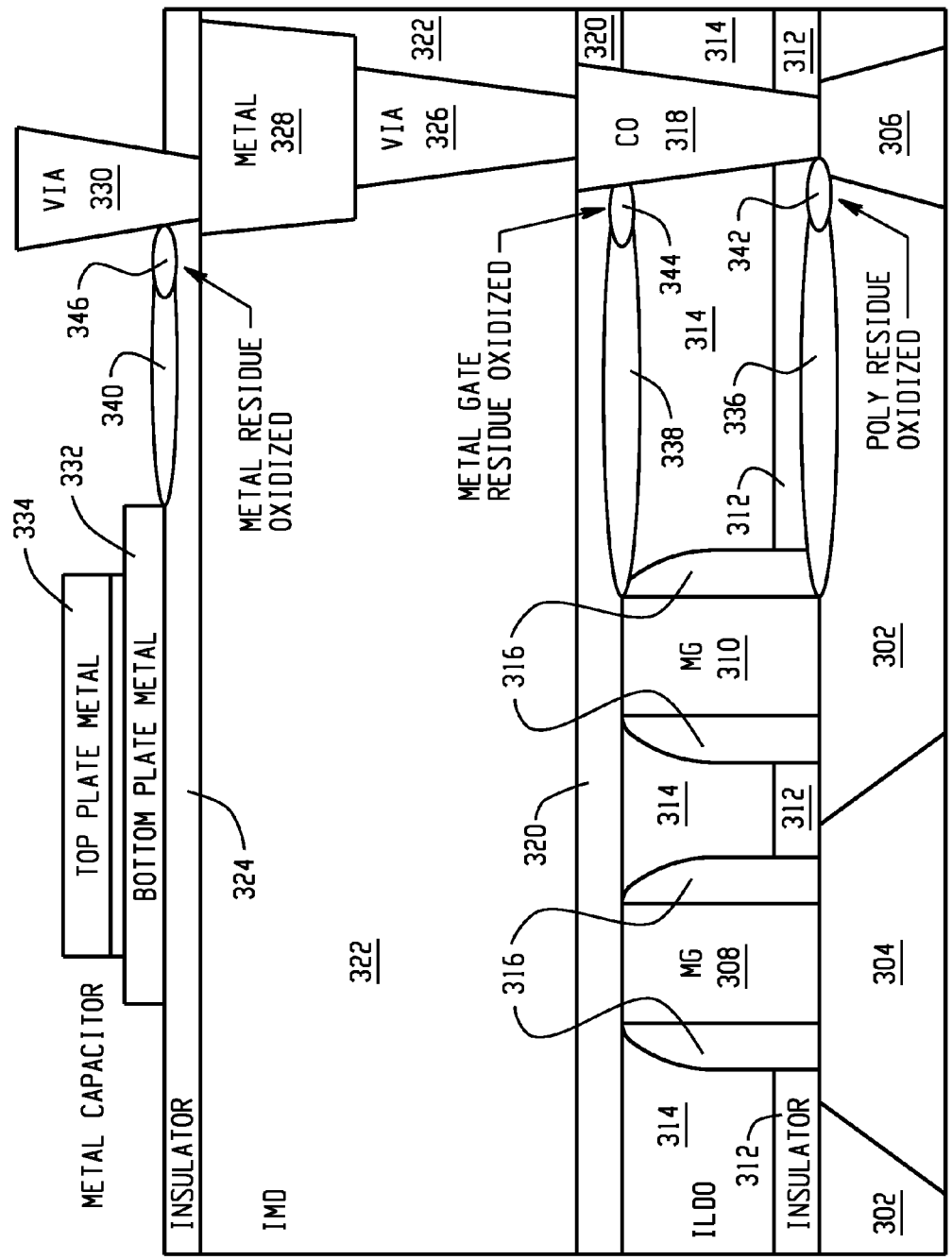
FIG. 8 depicts a cross-sectional view of another example semiconductor device, in accordance with some embodiments.

FIG. 8 depicts a cross-sectional view of another example semiconductor device. Depicted in FIG. 4 is a semiconductor device 300 having a substrate 302, a first OD region 304, a second OD region 306, a metal gate 308 of a first transistor, a metal gate 310 of a second transistor, a first insulator layer 312, an ILD0 314, spacers 316 surrounding the metal gates 308, 310, a contact 318, a second insulator layer 320, an intermediate dielectric layer 322, a third insulator layer 324, a first via 326, a metal contact 328, a second via 330, and a metal capacitor having a bottom metal plate 332 and a top metal plate 334.

The example semiconductor device 300 also has three unintended conductive items: poly residue 336 (e.g., residue from dummy poly gate removal), metal gate residue 338 (e.g., residue from metal gate etching operations), and metal residue 340 (e.g., residue from metal plate formation). The example semiconductor device 300 has non-conductive surface layer oxide applied to each of the three unintended conductive items. The poly residue 336 has an oxidized surface area 342 to prevent bridging between the contact 318 and the metal gate 310 through the poly residue 336. The metal gate residue 338 has an oxidized surface area 344 to prevent bridging between the contact 318 and the metal gate 310 through the metal gate residue 338. The metal residue 340 has an oxidized surface area 346 to prevent bridging between the via 330 and the metal plate 332 through the metal residue 340.

The preceding examples illustrate that in a semiconductor fabrication process the surface surrounding a void and side walls within the void may be oxidized, for example, by plasma oxidation in a last step in the void etching process. The surface oxide formed on an unintended conductive item by the oxidation operation may effectively block a potential leak path between conductive items that are intended to be isolated from each other.

In one embodiment, disclosed is a method of fabricating a semiconductor device with reduced leak paths. The method comprises etching a void in non-conductive material in the semiconductor device to provide a conduction path between isolated material, forming a non-conductive surface layer on an unintended conductive item adjacent to the void, and filling the void with a conductive material.

These aspects and other embodiments may include one or more of the following features. Forming a non-conductive surface layer may comprise oxidizing a surface surrounding the void. Forming a non-conductive surface layer may comprise oxidizing a side wall of the void. Forming a non-conductive surface layer may comprise oxidizing a surface surrounding the void using plasma oxidation operations. Forming a non-conductive surface layer may comprise oxidizing a side wall of the void using plasma oxidation operations. The unintended conductive item may comprise a conductive impurity or conductive residue. The void may comprise a trench or a hole for a via.

In another embodiment, a semiconductor device is disclosed. The semiconductor device comprises an area in which a void had been formed in non-conductive material in the semiconductor device to provide a conduction path between isolated material, a non-conductive surface layer formed on an unintended conductive item adjacent to the void area, and conductive material inside the void area.

These aspects and other embodiments may include one or more of the following features. The non-conductive surface layer may comprise a non-conductive oxide surface layer that is formed by oxidizing a surface surrounding the void. The non-conductive surface layer may comprise a non-conductive oxide surface layer that is formed by oxidizing a side wall of the void. The non-conductive surface layer may comprise a non-conductive oxide surface layer that is formed by oxidizing a surface surrounding the void using plasma oxidation operations. The non-conductive surface layer may comprise a non-conductive oxide surface layer that is formed by oxidizing a side wall of the void using plasma oxidation operations. The unintended conductive item may comprise a conductive impurity or conductive residue. The void may comprise a trench or a hole for a via.

In another embodiment, a semiconductor device is disclosed. The semiconductor device comprises a first non-conductive oxide surface layer formed on a first unintended conductive item and a second non-conductive oxide surface layer formed on a second unintended conductive item. Each of the first and second non-conductive oxide surface layers is adjacent to an area in which a void had been formed. Each of the first and second non-conductive oxide surface layers was formed after the void to which the respective non-conductive oxide surface layer is adjacent was etched but before the void was filled with conductive material.

These aspects and other embodiments may include one or more of the following features. The first unintended conductive item may be of a type different from that of the second unintended conductive item. Both the first unintended conductive item and the second unintended conductive item may comprise poly residue, metal gate residue or metal residue. The semiconductor device may comprise a third non-conductive oxide surface layer formed on a third unintended conductive item wherein the third unintended conductive item is of a type different from that of the first unintended conductive item and that of the second unintended conductive item. The first non-conductive oxide surface layer may be adjacent to the same void as the second non-conductive oxide surface layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    isolated materials;
    a non-conductive material having a void area in which a void is formed to provide a conduction path between the isolated materials;
    a conductive item having a first end adjacent to the void area and a second end;
    a non-conductive surface layer formed on the first end of the conductive item;
    a first conductive material inside the void area;
    a transistor including a second conductive material; and
    a spacer surrounding the second conductive material, wherein the second end of the conductive item extends through the spacer.

2. The semiconductor device of claim 1, wherein the non-conductive surface layer comprises a non-conductive oxide surface layer that is formed by oxidizing a surface surrounding the void area.

3. The semiconductor device of claim 1, wherein the non-conductive surface layer comprises a non-conductive oxide surface layer that is formed by oxidizing a side wall of the void.

4. The semiconductor device of claim 1, wherein the non-conductive surface layer comprises a non-conductive oxide surface layer that is formed by oxidizing a surface surrounding the void using plasma oxidation operations.

5. The semiconductor device of claim 1, wherein the non-conductive surface layer comprises a non-conductive oxide surface layer that is formed by oxidizing a side wall of the void using plasma oxidation operations.

6. The semiconductor device of claim 1, wherein the conductive item comprises a conductive impurity or conductive residue.

7. The semiconductor device of claim 1, wherein the void comprises a trench or a hole for a via.

8. A semiconductor device comprising:
    a first conductive material;
    a transistor including a second conductive material;
    a first conductive item disposed between the first and second conductive materials, having opposite first and second ends, and including a material the same as the second conductive material;
    a first non-conductive oxide surface layer interconnecting the first end of the first conductive item and the first conductive material; and
    a spacer surrounding the second conductive material, wherein the second end of the first conductive item extends through the spacer and is connected to the second conductive material.

9. The semiconductor device of claim 8, further comprising:
    a second conductive item; and
    a second non-conductive oxide surface layer formed on the second conductive item;
    wherein the second non-conductive oxide surface layer is adjacent to an area in which a void is formed, and wherein the second non-conductive oxide surface layer is formed after the void is etched but before the void is filled with a conductive material.

10. The semiconductor device of claim 9, wherein the first conductive item is of a type different from that of the second conductive item.

11. The semiconductor device of claim 9, wherein the first conductive item comprises poly residue, metal gate residue or metal residue and the second conductive item comprises poly residue, metal gate residue or metal residue.

12. The semiconductor device of claim 11, wherein the first conductive item is of a type different from that of the second conductive item.

13. The semiconductor device of claim 9, further comprising:
    a third conductive item; and
    a third non-conductive oxide surface layer formed on the third conductive item, wherein the third conductive item is of a type different from that of the first conductive item and that of the second conductive item.

14. The semiconductor device of claim 9, wherein the first non-conductive oxide surface layer is adjacent to the same void as the second non-conductive oxide surface layer.

15. The semiconductor device of claim 8, further comprising:
    a third conductive material;
    a capacitor including the second a fourth conductive material;
    a second conductive item including a material the same as the fourth conductive material; and
    a second non-conductive oxide surface layer disposed between the second conductive item and the third conductive material.

16. The semiconductor device of claim 8, wherein the first conductive item includes a polysilicon material.

17. The semiconductor device of claim 8, further comprising:
    a pair of vias one disposed above the other;
    a second conductive item including a material the same as the second conductive material; and
    a second non-conductive oxide surface layer disposed between the second conductive item and a junction of the vias.

18. The semiconductor device of claim 8, further comprising:
    a pair of vias;
    a second conductive item having first and second ends;
    a second non-conductive oxide surface layer interconnecting the second end of the second conductive item and one of the vias; and
    a third non-conductive oxide surface layer disposed between the first end of the second conductive item and the other of the vias.

* * * * *